United States Patent
Wu et al.

(10) Patent No.: US 7,170,168 B2
(45) Date of Patent: Jan. 30, 2007

(54) FLIP-CHIP SEMICONDUCTOR PACKAGE WITH LEAD FRAME AND METHOD FOR FABRICATING THE SAME

(75) Inventors: Chi-Chuan Wu, Taichung Hsien (TW); Ke-Chuan Yang, Taichung Hsien (TW)

(73) Assignee: Siliconware Precision Industries Co., Ltd. (TW)

( * ) Notice: Subject to any disclaimer, the term of this patent is extended or adjusted under 35 U.S.C. 154(b) by 35 days.

(21) Appl. No.: 10/965,093

(22) Filed: Oct. 13, 2004

(65) Prior Publication Data

US 2006/0017173 A1    Jan. 26, 2006

(30) Foreign Application Priority Data

Jul. 23, 2004   (TW)   ................. 93122014 A

(51) Int. Cl.
*H01L 23/48* (2006.01)

(52) U.S. Cl. .................. 257/734; 257/666; 257/673; 257/676; 257/692; 257/773; 257/775; 257/778; 257/E23.031; 257/E23.037; 257/E23.043; 438/123

(58) Field of Classification Search ................ 257/790, 257/734
See application file for complete search history.

(56) References Cited

U.S. PATENT DOCUMENTS

| | | | | |
|---|---|---|---|---|
| 4,670,770 A | * | 6/1987 | Tai ............................. | 257/777 |
| 5,331,235 A | * | 7/1994 | Chun ......................... | 257/777 |
| 5,731,631 A | * | 3/1998 | Yama et al. ................ | 257/702 |
| 6,091,134 A | * | 7/2000 | Sakamoto et al. .......... | 257/666 |
| 6,388,336 B1 | * | 5/2002 | Venkateshwaran et al. . | 257/779 |
| 6,472,731 B2 | * | 10/2002 | Chew ......................... | 257/676 |
| 6,597,059 B1 | * | 7/2003 | McCann et al. ............ | 257/673 |
| 6,661,087 B2 | | 12/2003 | Wu | |
| 6,664,130 B2 | * | 12/2003 | Akram ....................... | 438/108 |
| 6,890,793 B2 | * | 5/2005 | Singh ......................... | 438/107 |
| 6,893,901 B2 | * | 5/2005 | Madrid ...................... | 438/122 |
| 2003/0067057 A1 | * | 4/2003 | Wu ............................. | 257/666 |
| 2003/0230792 A1 | * | 12/2003 | Wu et al. ................... | 257/666 |

FOREIGN PATENT DOCUMENTS

TW                 540123              4/2003

* cited by examiner

*Primary Examiner*—Minhloan Tran
*Assistant Examiner*—Eduardo A. Rodela
(74) *Attorney, Agent, or Firm*—Peter F. Corless; Steven M. Jensen; Edwards Angell Palmer & Dodge LLP

(57) ABSTRACT

A flip-chip semiconductor package with a lead frame and a method for fabricating the same are provided. The lead frame has a plurality of leads, each lead having an upper surface, a lower surface, and an inner end directed toward the center of the lead frame. A recessed portion is formed on the upper surface of the inner end of each lead, making the inner end shaped as a stepped structure. The depth of the recessed portion is equal to a height of a reflow-collapsed solder bump that is for electrically connecting a chip to the lead. At least one chip is electrically connected to the leads in a flip-chip manner via a plurality of solder bumps bonded to the recessed portions. An encapsulation body is formed to encapsulate the lead frame, chip and solder bumps, with the lower surfaces of the leads being exposed from the encapsulation body.

16 Claims, 5 Drawing Sheets

US 7,170,168 B2

FLIP-CHIP SEMICONDUCTOR PACKAGE WITH LEAD FRAME AND METHOD FOR FABRICATING THE SAME

FIELD OF THE INVENTION

The present invention relates to semiconductor packages and fabrication methods thereof, and more particularly, to a FCQFN (flip-chip quad flat non-leaded) semiconductor package with a lead frame, allowing at least one chip to be mounted in a flip-chip manner on leads of the lead frame, and a method for fabricating the FCQFN semiconductor package.

BACKGROUND OF THE INVENTION

A flip-chip semiconductor package with a lead frame is a combination of the lead frame serving as a chip carrier and a flip-chip structure in which a semiconductor chip is mounted on the lead frame in a flip-chip manner. Such semiconductor package comprises: the lead frame having a plurality of leads, or having a plurality of leads and a die pad; at least one chip, which is mounted and electrically connected to the leads via a plurality of solder bumps formed on an active surface of the chip, or which is mounted on the die pad and electrically connected to the leads via a plurality of solder bumps formed on the active surface of the chip; and an encapsulation body for encapsulating the lead frame, the chip and the solder bumps. This packaging technology provides an advantage that the solder bumps are self-aligned and can be completely bonded to the leads in a single process, which thereby is relatively more time- and labor-effective, unlike a conventional wiring method by which a plurality of bonding wires for the electrical connection between chip and leads need to be formed one by one.

Since the solder bumps are usually made of tin (Sn) 63/lead (Pb) 37 alloy, and the lead frame is made of a solderable metal such as copper, during a reflow process for soldering the solder bumps to the leads, the solder bumps under a particular high temperature would melt and collapse to form eutectic, thus resulting in an intermetallic compound between the solder bumps and the leads, and which is customarily referred to as a wetting step. Since the copper-made leads have good wettability, the solder bumps bonded to predetermined positions on the leads may keep collapsing and diffuse to other areas on the leads. This over-collapsing effect not only causes bridging between adjacent solder bumps and electrical failure, but also degrades the quality of mounting the chip on the lead frame and adversely affects the performance of subsequent fabrication processes due to serious deformation of the solder bumps.

In accordance with the above drawbacks, there are developed several methods of performing a soldering-proof treatment for a lead frame. One is disclosed in Taiwanese Patent No. 540123. As shown in FIG. 5, a recess 12 is formed at a bonding area on each lead 10 of a lead frame 1, and a protruded block member 13 is provided beside the recess 12, wherein the bonding area is a predetermined position where a solder bump 11 is subsequently implanted. The block member 13 can be a polyimide tape, a solder mask, or a suitable resin material. When a chip 14 formed with solder bumps 11 thereon is to be mounted on the leads 10, the solder bumps 11 are reflowed to the recesses 12 at the bonding areas on the leads 10. The blocks 13 would prevent over collapsing of the solder bumps 11, and the recesses 12 increase a contact area for wetting, such that the solder bumps would only collapse within the bonding areas but not over collapse or diffuse to other areas on the leads 10.

Another soldering-proof treatment for a lead frame is disclosed in U.S. Pat. No. 6,661,087. As shown in FIG. 6, a lead frame 1' having a die pad 15 and a plurality of leads 10 is used, wherein the die pad 15 is raised in elevation by a conventional stamping technique to be higher than the leads 10, forming a predetermined height difference between the die pad 15 and the leads 10, and this height difference does not exceed a height of solder bumps 11 that are used for electrically connecting a chip 14 to the leads 10. When the solder bumps 11 formed on the chip 14 are to be bonded to the leads 10, during a reflow process heated to a particular temperature, the solder bumps 11 start collapsing, and the chip 14 is moved downwardly by gravity attraction due to its weight until reaching the die pad 15. At this time, the chip 14 is blocked by the die pad 15 from further movement and stops, making the solder bumps 11 stop collapsing to remain at a fixed height (which is equal to the height difference between the die pad 15 and the leads 10). This thereby can prevent over-collapsing of the solder bumps 11.

However, the methods shown in FIGS. 5 and 6 need to form recesses and block members on the leads of the lead frame (FIG. 5) and to raise the die pad of the lead frame and form a height difference between the die pad and the leads (FIG. 6). Such structured lead frames require complex fabrication processes and make the fabrication cost increased. Moreover, in FIG. 6, the central area of the chip is attached to the die pad. In case bond pads on the chip for mounting solder bumps are provided at or close to the central area, such chip is not suitably subject to the method of FIG. 6.

Therefore, the problem to be solved here is to provide a flip-chip semiconductor package with a lead frame, which can be fabricated by simplified processes without greatly increasing the cost, and also can prevent solder bumps for electrically connecting a chip to leads from over-collapsing, as well as assure the reliability of the fabricated package.

SUMMARY OF THE INVENTION

A primary objective of the present invention is to provide a flip-chip semiconductor package with a lead frame and a method for fabricating the same, wherein recessed portions are formed on upper surfaces of inner ends of leads of the lead frame, such that solder bumps for electrically connecting a chip to the leads are bonded to the recessed portions and would not over collapse to other areas on the leads, thereby assuring the reliability of the fabricated package.

Another objective of the invention is to provide a flip-chip semiconductor package with a lead frame and a method for fabricating the same, which can use simplified fabrication processes and would not greatly increase the fabrication cost, as well as can prevent solder bumps for electrically connecting a chip to leads from over-collapsing.

Still another objective of the invention is to provide a flip-chip semiconductor package with a lead frame and a method for fabricating the same, which do not require a die pad for supporting a chip and are suitable for a chip having bond pads located at central positions.

A further objective of the invention is to provide a flip-chip semiconductor package with a lead frame and a method for fabricating the same, which can increase an contact area between leads of the lead frame and an encapsulation body for encapsulating a chip, making the encapsulation body more firmly bonded to the lead frame.

In accordance with the above and other objectives, the present invention proposes a flip-chip semiconductor package with a lead frame, comprising: the lead frame, which has a plurality of leads, each of the leads having an upper surface, a lower surface and an inner end directed toward the center of the lead frame, wherein a first recessed portion is formed on the upper surface of the inner end of each of the leads, making the inner end shaped as a stepped structure, and the first recessed portion has a depth equal to a height of a collapsed solder bump that is for electrically connecting at least one chip to the lead; the at least one chip, which has an active surface and a non-active surface, wherein the active surface is electrically connected to the leads via a plurality of the solder bumps that are bonded to the first recessed portions respectively, and peripheral areas of the active surface of the chip are in contact with areas on the upper surfaces of at least three of the leads free of having the first recessed portions; and an encapsulation body for encapsulating the lead frame, the chip and the solder bumps, with the lower surfaces of the leads being exposed from the encapsulation body.

The above semiconductor package can be prepared by a fabrication method comprising the steps of: preparing a lead frame having a plurality of leads, each of the leads having an upper surface, a lower surface and an inner end directed toward the center of the lead frame, and forming a first recessed portion on the upper surface of the inner end of each of the leads such that the inner end is shaped as a stepped structure, wherein the first recessed portion has a depth equal to a height of a collapsed solder bump that is for electrically connecting at least one chip to the lead; preparing the at least one chip, which has an active surface and a non-active surface, with a plurality of the solder bumps being formed on the active surface, and allowing the plurality of solder bumps to be bonded to the first recessed portions respectively so as to electrically connect the chip to the leads, wherein peripheral areas of the active surface of the chip are in contact with areas on the upper surfaces of at least three of the leads free of having the first recessed portions; and forming an encapsulation body for encapsulating the lead frame, the chip and the solder bumps, with the lower surfaces of the leads being exposed from the encapsulation body.

The semiconductor package can be a FCQFN (flip-chip quad flat non-leaded) semiconductor package. The first recessed portions on the upper surfaces of the inner ends of the leads can be fabricated by half-etching, such that the first recessed portions have a depth about half of the thickness of the rest part of the leads. Second recessed portions may further be formed by a stamping technique on the lower surfaces of the inner ends of the leads respectively, allowing areas on lower surfaces of the leads not having the second recessed portions to be exposed from the encapsulation body.

By the flip-chip semiconductor package with a lead frame and a method for fabricating the same in the present invention, first recessed portions are formed on the upper surfaces of the inner ends of the leads and have a depth equal to a height of reflow-collapsed solder bumps that are for electrically connecting a chip to the leads. When the solder bumps melt and collapse at a high temperature during a reflow process, the chip is moved downwardly by gravity attraction due to its weight until peripheral areas of its surface reaches areas of the upper surfaces of at least three leads not having the first recessed portions and the chip gains support from the at least three leads. As a result, the chip and the first recessed portions form a fixed space where the solder bumps collapse in a control manner that the collapsed solder bumps are completely received in the space and have a fixed height corresponding to the depth of the first recessed portions that is predetermined to be equal to the height of collapsed solder bumps, such that the solder bumps would not over-collapse or over-diffuse to other areas on the leads. Therefore, the chip can be well electrically connected to the leads via the solder bumps bonded to the first recessed portions, thereby assuring the reliability of the fabricated package. Moreover, the first recessed portions on the leads can be formed by a conventional half-etching technique and simultaneously with fabrication of the lead frame, which thereby would not significantly increase the overall process complexity and cost for the package. Furthermore, besides being electrically connected to the leads via the solder bumps, the chip is also supported by the areas of at least three leads not having the first recessed portions. As such, the lead frame needs not have a die pad for carrying the chip, and a chip having central bond pads is also suitable in the present invention. In addition, provision of the first recessed portions increases a contact area between the leads and an encapsulation body that is for encapsulating the chip, such that the encapsulation body can be more strongly bonded to the lead frame, thereby improving the reliability of the fabricated package. In another embodiment, second recessed portions are further formed on the lower surfaces of the leads and filled with the encapsulation body. Besides further increasing the contact area and bonding strength between the leads and the encapsulation body, provision of the second recessed portions allows the fabricated package to have the desirable specification for QFN contact pads without affecting subsequent applications of the package.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Figure 1:
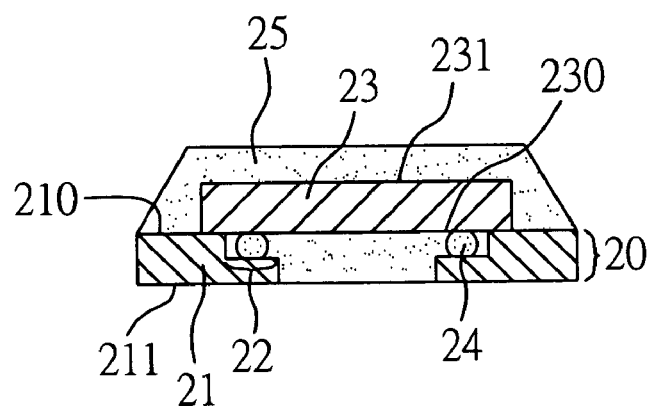
FIG. 1 is a cross-sectional view of a flip-chip semiconductor package with a lead frame according to a first preferred embodiment of the present invention.

As shown in FIG. 1, a flip-chip semiconductor package with a lead frame proposed in a first preferred embodiment of the present invention comprises: a lead frame 20 having a plurality of leads 21, each lead 21 having an upper surface 210, a lower surface 211, and an inner end directed toward the center of the lead frame 20, wherein a recessed portion 22 having a predetermined depth is formed on the upper surface 210 of the inner end of each lead 21, making the inner end shaped as a stepped structure, and the depth of the recessed portion 22 is predetermined to be equal to a height of a reflow-collapsed solder bump 24 that is for electrically connecting a chip 23 to the leads 24; at least one of the chip 23 having an active surface 230 and a non-active surface 231, wherein the active surface 230 of the chip 23 is electrically connected to the leads 21 via a plurality of the solder bumps 24 bonded to the recessed portions 22, and peripheral areas of the active surface 230 of the chip 23 are in contact with areas of at least three leads 21 not having the recessed portions 22 so as to stop further collapsing of the solder bumps 24; and an encapsulation body 25 for encapsulating the lead frame 20, the chip 23 and the solder bumps 24, with the lower surfaces 211 of the leads 21 being exposed from the encapsulation body 25. This flip-chip semiconductor package with a lead frame may be a flip-chip quad flat non-leaded (FCQFN) semiconductor package.

The above flip-chip semiconductor package with a lead frame can be fabricated by the procedural steps shown in FIGS. 2A to 2E.

Figure 2A:
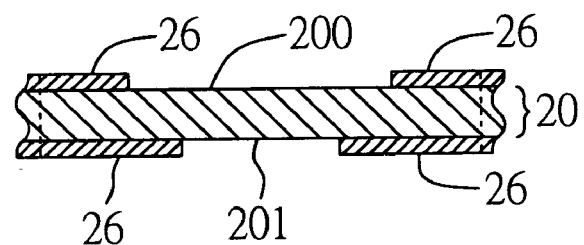
FIGS. 2A to 2E are schematic diagrams showing procedural steps of a method for fabricating the semiconductor package of FIG. 1.

First, referring to FIG. 2A, a metal layer 20 (such as copper layer) for fabricating a lead frame is provided. A photoresist 26 is applied respectively over an upper surface 200 and a lower surface 201 of the metal layer 20. Then, the photoresist 26 is patterned by exposure, development and etching processes to expose predetermined areas on the upper and lower surfaces 200, 201 of the metal layer 20 respectively, wherein the exposed area (or non-photoresist covering area) on the upper surface 200 is larger than the exposed area on the lower surface 201.

Figure 2B:
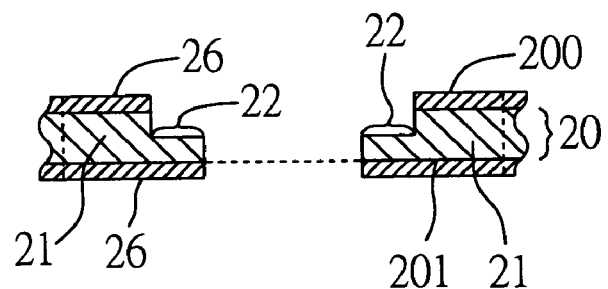

Referring to FIG. 2B, a half-etching process is performed on the exposed areas of the upper and lower surfaces 200, 201 of the metal layer 20. A copper etchant is used to simultaneously etch the exposed areas of the upper and lower surfaces 200, 201 of the metal layer 20 until substantially removing half of the thickness of the metal layer 20, such that the non-photoresist covering part of the metal layer 20 is removed to form a plurality of leads 21, and the non-photoresist covering area on the upper surface 200 larger than the non-photoresist covering area on the lower surface 201 is half-etched to form a recessed portion 22 on each of the leads 21. The depth of the recessed portion 22 (e.g. about 0.12 mm) is substantially half of the thickness of the metal layer 20 or the rest part of the lead 21, wherein the depth of the recessed portion 22 is made substantially equal to a height of a collapsed solder bump (not shown) that is to be subsequently bonded to the recessed portion 22. For example, if the height of the collapsed solder bump is in advance estimated to be h1, then the depth of the recessed portion 22 is predetermined as h1, and the thickness of the metal layer 20 or the rest part of the lead 21 is predetermined as 2×h1, such that the recessed portion 22 can be fabricated according to these data.

Figure 2C:
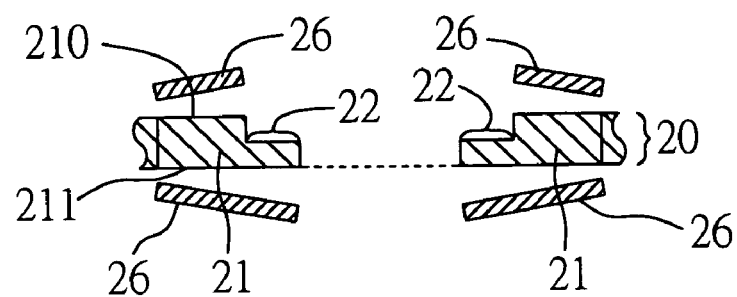

Then, referring to FIG. 2C, after completing the above half-etching process, the photoresist 26 is removed from the metal layer 20, such that a lead frame 20 (designated by the same reference numeral as the metal layer) having the plurality of leads 21 is formed. Each of the leads 21 has an upper surface 210, a lower surface 211, and an inner end directed toward the center of the lead frame 20, wherein the recessed portion 22 is located at the inner end of each lead 21, making the inner end shaped as a stepped structure. Moreover, surface areas of the lead 21 not having the recessed portion 22 (sec FIG. 2C") can be selectively subject to a black oxidation process. The black-oxidized surface areas can be prevented from electrical interference with an active surface of a chip (not shown) to be subsequently mounted on the leads 21 and also inhibit over-collapsing or over-diffusion of a solder bump (not shown) to be subsequently bonded to the recessed portion 22.

Figure 2D:
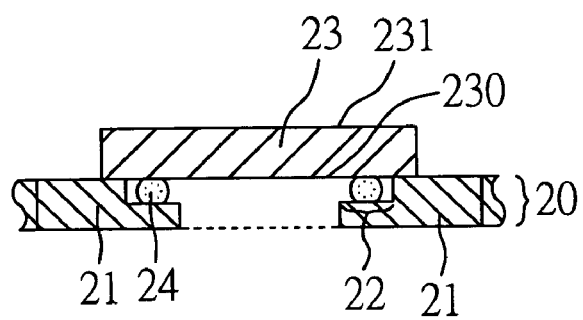

Referring to FIG. 2D, at least one chip 23 is prepared. The chip 23 has an active surface 230 and a non-active surface 231, wherein the active surface 230 is a surface mounted with a plurality of electronic elements and circuits (not shown). Then, the chip 23 is mounted on the leads 21 of the lead frame 20 in a flip-chip manner that, a plurality of solder bumps 24 formed on predetermined positions (i.e. bond pads, not shown) on the active surface 230 are bonded to the recessed portions 22 of the leads 21 respectively. This is accomplished by performing a reflow process to allow the solder bumps 24 to melt and collapse at a high temperature to be welded to the recessed portions 22. During the melting and collapsing of the solder bumps 24, the chip 23 is moved downwardly by gravity attraction due to its weight until peripheral areas of its active surface 230 reaches areas on the upper surfaces 210 of at least three leads 21 not having the recessed portions 22, making the chip 23 and the recessed portions 22 form a fixed space where the solder bumps 24 collapse in a control manner that the collapsed solder bumps 24 are completely received in the space and have a fixed height corresponding to the depth of the recessed portions 22 that is predetermined to be equal to the height of a collapsed solder bump, such that the solder bumps 24 would not over-collapse or over-diffuse to other areas on the leads 21. As a result, the active surface 230 of the chip 23 can be properly electrically connected to the leads 21 via the solder bumps 24 bonded to the recessed portions 22, thereby establishing the electrical connection between the chip 23 and the lead frame 20.

Figure 2E:
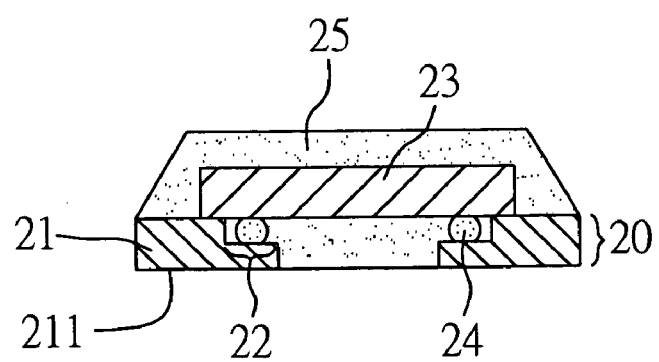
Figure 2C:
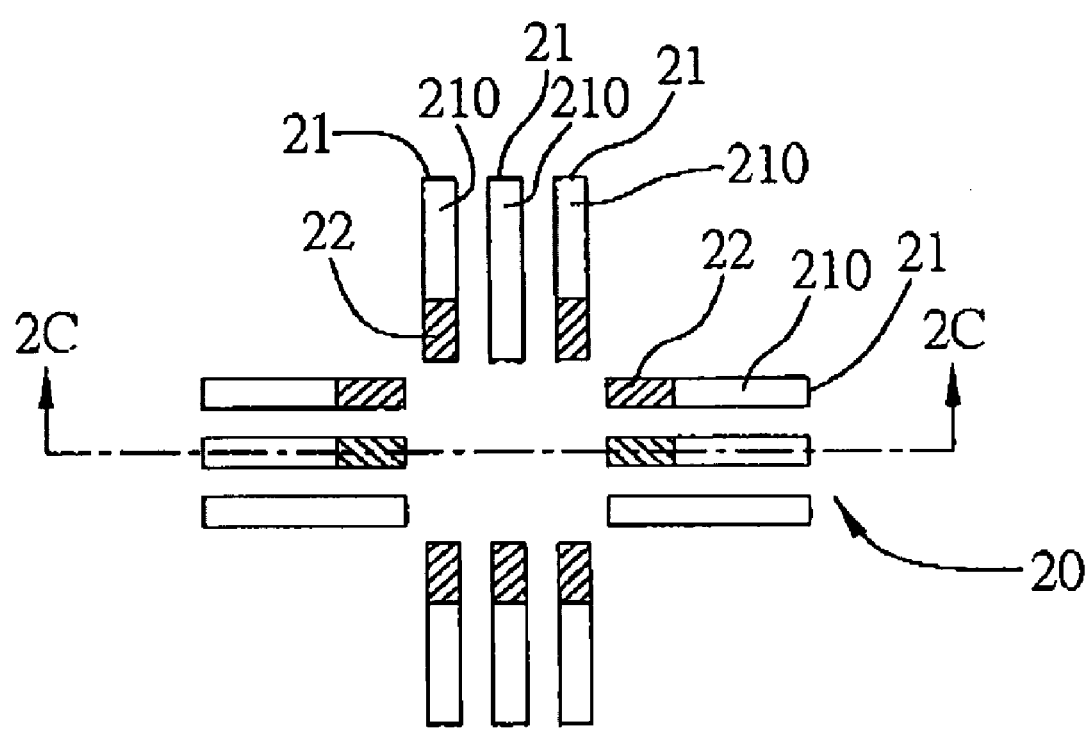

Finally, referring to FIG. 2E, a molding process is performed. The above lead frame 20 mounted with the chip 23 and the solder bumps 24 is placed in a cavity of a mold (not shown), allowing the lower surfaces 211 of the leads 21 to be in contact with a bottom wall of the cavity. Then, a resin material such as epoxy resin is injected into the cavity and allowed to encapsulate the lead frame 20, the chip 23 and the solder bumps 24, and the resin material is cured to form an encapsulation body 25. After the encapsulation body 25 is fabricated, the mold is removed, and the lower surfaces 211 of the leads 21 in contact with the bottom wall of the cavity are exposed from the encapsulation body 25. This thus completes the fabrication of the semiconductor package in the present invention, wherein the exposed lower surfaces 211 of the leads 21 may serve as contact pads for a QFN package to establish electrical connection with an external device (not shown). The above molding process pertains to conventional technology and is not to be further detailed. Provision of the recessed portions 22 increases a contact area between the leads 21 and the encapsulation body 25, such that the encapsulation body 25 can be more strongly bonded to the lead frame 20, thereby improving the reliability of the fabricated package.

Figure 3:
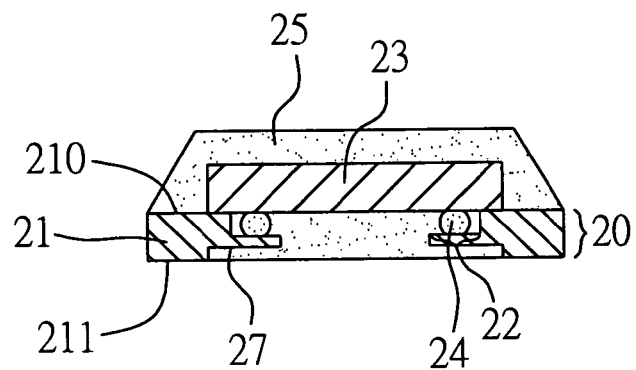
FIG. 3 is a cross-sectional view of a flip-chip semiconductor package with a lead frame according to a second preferred embodiment of the present invention.

FIG. 3 shows a semiconductor package according to a second preferred embodiment of the present invention. As shown in FIG. 3, this second embodiment differs from the above first embodiment in that, the lead frame 20 further comprises another recessed portion 27 (hereinafter referred to as "second recessed portion") formed on the lower surface 211 of each of the leads 21 at a position substantially corresponding to the recessed portion 22 (hereinafter referred to as "first recessed portion") on the upper surface 210 of the lead 21.

Figure 4:
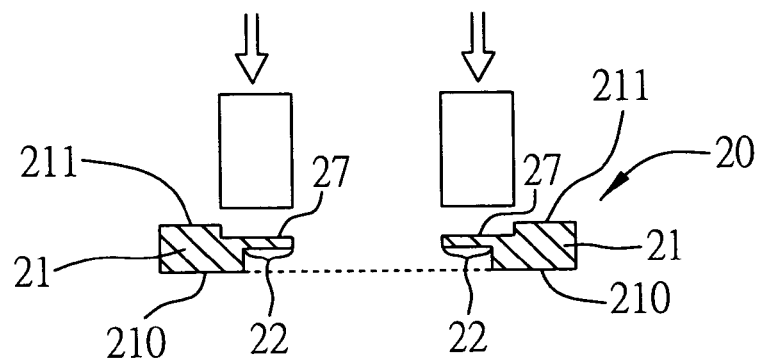
FIG. 4 is a schematic diagram showing a step of forming second recessed portions in the semiconductor package of FIG. 3.
Figure 5:
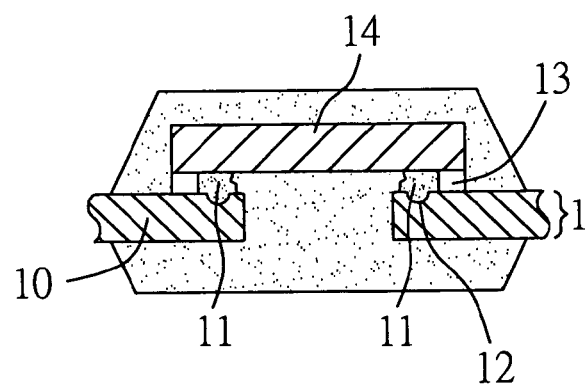
FIG. 5 (PRIOR ART) is a cross-sectional view of a conventional semiconductor package disclosed in Taiwanese Patent No. 540123.
Figure 6:
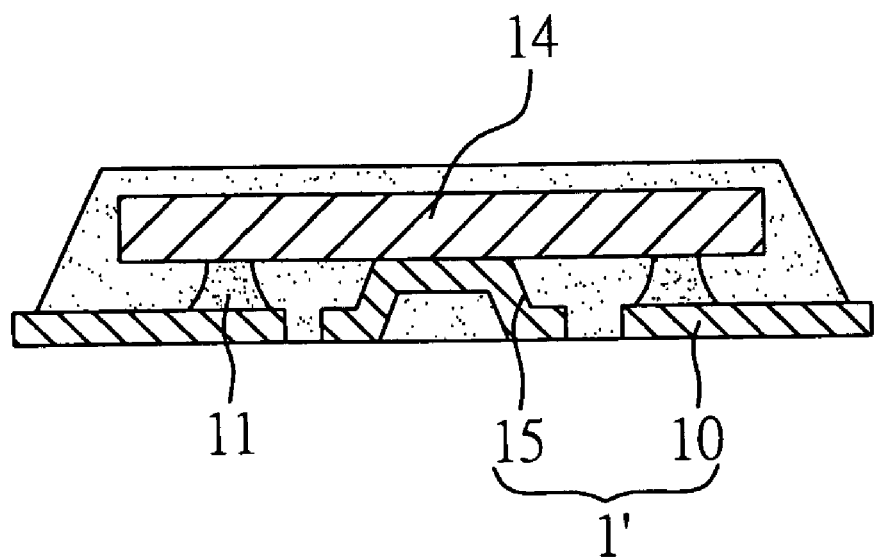
FIG. 6 (PRIOR ART) is a cross-sectional view of a conventional semiconductor package disclosed in U.S. Pat. No. 6,661,087.

As shown in FIG. 4, during the fabrication of the lead frame 20, when the first recessed portions 22 are formed, the lead frame 20 is turned upside down to face the lower surfaces 211 of the leads 21 upwardly. A conventional stamping technique is adopted to punch the lower surfaces 211 of the inner ends of the leads 21 and form the second recessed portions 27 having a predetermined size such as a depth of about 2–4 mils. After the second recessed portions 27 are fabricated, the lead frame 20 is turned again to face the upper surfaces 210 of the leads 21 upwardly. This thus completes the fabrication of the lead frame 20 that is ready for subsequent die-bonding and molding processes.

Further referring to FIG. 3, during the die-bonding process, the chip 23 is mounted via the solder bumps 24 on the leads 21 having both the first recessed portions 22 and the second recessed portions 27. Such leads 21 still have sufficient mechanical strength to support the chip 23 and the solder bumps 24. During the molding process, the resin material for making the encapsulating body 25 is allowed to fill the second recessed portions 27, such that areas of the lower surfaces 211 of the leads 21 not having the second recessed portions 27 are exposed from the encapsulating body 25. Provision of the second recessed portions 27 further increases the contact area between the leads 21 and the encapsulation body 25, such that the encapsulation body 25 can be further strongly bonded to the lead frame 20, and the fabricated package may have the desirable specification for QFN contact pads without affecting subsequent applications of the package.

By the flip-chip semiconductor package with a lead frame and a method for fabricating the same in the present invention, recessed portions (i.e. first recessed portions) are formed on the upper surfaces of the inner ends of the leads and have a depth equal to a height of reflow-collapsed solder bumps that are for electrically connecting a chip to the leads. When the solder bumps melt and collapse at a high temperature during a reflow process, the chip is moved downwardly by gravity attraction due to its weight until peripheral areas of its surface reaches areas of the upper surfaces of at least three leads not having the first recessed portions and the chip gains support from the at least three leads. As a result, the chip and the first recessed portions form a fixed space where the solder bumps collapse in a control manner that the collapsed solder bumps are completely received in the space and have a fixed height corresponding to the depth of the first recessed portions that is predetermined to be equal to the height of collapsed solder bumps, such that the solder bumps would not over-collapse or over-diffuse to other areas on the leads. Therefore, the chip can be well electrically connected to the leads via the solder bumps bonded to the first recessed portions, thereby assuring the reliability of the fabricated package. Moreover, the first recessed portions on the leads can be formed by a conventional half-etching technique and simultaneously with fabrication of the lead frame, which thereby would not significantly increase the overall process complexity and cost for the package. Furthermore, besides being electrically connected to the leads via the solder bumps, the chip is also supported by the areas of at least three leads not having the first recessed portions. As such, the lead frame needs not have a die pad for carrying the chip, and a chip having central bond pads is also suitable in the present invention. In addition, provision of the first recessed portions increases a contact area between the leads and an encapsulation body that is for encapsulating the chip, such that the encapsulation body can be more strongly bonded to the lead frame, thereby improving the reliability of the fabricated package. In another embodiment, second recessed portions are further formed on the lower surfaces of the leads and filled with the encapsulation body. Besides further increasing the contact area and bonding strength between the leads and the encapsulation body, provision of the second recessed portions allows the fabricated package to have the desirable specification for QFN contact pads without affecting subsequent applications of the package.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A flip-chip semiconductor package with a lead frame, comprising:

the lead frame, which has a plurality of leads, each of the leads having an upper surface, a lower surface and an inner end directed toward the center of the lead frame, wherein a first recessed portion is formed on the upper surface of the inner end of each of the leads, making the inner end shaped as a stepped structure, and the first recessed portion has a depth equal to a height of a collapsed solder bump that is for electrically connecting at least one chip to the lead;

the at least one chip, which has an active surface and a non-active surface, wherein the active surface is electrically connected to the leads via a plurality of the solder bumps that are bonded to the first recessed portions respectively, and peripheral areas of the active surface of the chip are in contact with areas on the upper surfaces of at least three of the leads free of having the first recessed portions; and an encapsulation body for encapsulating the lead frame, the chip and the solder bumps, with the lower surfaces of the leads being exposed from the encapsulation body.

2. The flip-chip semiconductor package of claim 1, wherein the depth of the first recessed portion is substantially half of a thickness of the rest part of the lead.

3. The flip-chip semiconductor package of claim 2, wherein the first recessed portion is formed by half-etching the inner end of the lead.

4. The flip-chip semiconductor package of claim 1, wherein the area of the lead free of having the first recessed portion is subject to black oxidation.

5. The flip-chip semiconductor package of claim 1, wherein a second recessed portion is formed on the lower surface of the inner end of the lead and filled with the encapsulation body, allowing an area of the lower surface of the lead free of having the second recessed portion to be exposed from the encapsulation body.

6. The flip-chip semiconductor package of claim 5, wherein the second recessed portion is formed by stamping.

7. The flip-chip semiconductor package of claim 1, wherein the solder bumps are completely received in a space formed by the chip and the first recessed portions.

8. The flip-chip semiconductor package of claim 1, which is a flip-chip quad flat non-leaded (FCQFN) semiconductor package.

9. A method for fabricating a flip-chip semiconductor package with a lead frame, comprising the steps of:

preparing the lead frame, which has a plurality of leads, each of the leads having an upper surface, a lower surface and an inner end directed toward the center of the lead frame, and forming a first recessed portion on the upper surface of the inner end of each of the leads such that the inner end is shaped as a stepped structure, wherein the first recessed portion has a depth equal to a height of a collapsed solder bump that is for electrically connecting at least one chip to the lead;

preparing the at least one chip, which has an active surface and a non-active surface, with a plurality of the solder bumps being formed on the active surface, and allowing the plurality of solder bumps to be bonded to the first recessed portions respectively so as to electrically connect the chip to the leads, wherein peripheral areas of the active surface of the chip are in contact with areas on the upper surfaces of at least three of the leads free of having the first recessed portions; and forming an encapsulation body for encapsulating the lead frame, the chip and the solder bumps, with the lower surfaces of the leads being exposed from the encapsulation body.

10. The method of claim 9, wherein the depth of the first recessed portion is substantially half of a thickness of the rest part of the lead.

11. The method of claim 10, wherein the first recessed portion is formed by half-etching the inner end of the lead.

12. The method of claim 9, wherein the area of the lead free of having the first recessed portion is subject to black oxidation.

13. The method of claim 9, further comprising forming a second recessed portion on the lower surface of the inner end of the lead, and allowing the encapsulation body to fill the second recessed portion, such that an area of the lower surface of the lead free of having the second recessed portion is exposed from the encapsulation body.

14. The method of claim 13, wherein the second recessed portion is formed by stamping.

15. The method of claim 9, wherein the solder bumps are completely received in a space formed by the chip and the first recessed portions.

16. The method of claim 9, wherein the semiconductor package is a flip-chip quad flat non-leaded (FCQFN) semiconductor package.

* * * * *